United States Patent [19]
Wada et al.

[11] Patent Number: 5,723,367
[45] Date of Patent: Mar. 3, 1998

[54] WIRING FORMING METHOD

[75] Inventors: Junichi Wada; Shohei Shima, both of Yokohama, Japan

[73] Assignee: Kabushiki Kaisha Toshiba, Kawasaki, Japan

[21] Appl. No.: 603,187

[22] Filed: Feb. 20, 1996

Related U.S. Application Data

[63] Continuation of Ser. No. 341,142, Nov. 16, 1994, abandoned.

[30] Foreign Application Priority Data

| Nov. 16, 1993 | [JP] | Japan | 5-286987 |
| Jul. 26, 1994 | [JP] | Japan | 6-174234 |
| Oct. 31, 1994 | [JP] | Japan | 6-267428 |

[51] Int. Cl.$^6$ ............ H01L 21/324; C23C 14/34; B05D 5/12
[52] U.S. Cl. ............ 437/248; 437/247; 437/203; 437/194; 204/192.15; 204/192.17; 204/192.3; 204/192.25; 427/97; 427/99; 427/117; 427/118; 427/120; 427/123; 427/124
[58] Field of Search .......... 204/192.12, 192.15, 204/192.17, 192.3; 437/247, 248, 203, 194; 427/96, 97, 99, 117, 118, 120, 123, 124, 331

[56] References Cited

U.S. PATENT DOCUMENTS

| 4,756,810 | 7/1988 | Lamont, Jr. et al. | 204/192.3 |
| 4,816,126 | 3/1989 | Kamoshida et al. | 204/192.3 |
| 4,999,096 | 3/1991 | Nihei et al. | 204/192.3 |
| 5,171,412 | 12/1992 | Talieh et al. | 204/192.12 |
| 5,200,030 | 4/1993 | Cho et al. | 437/203 |
| 5,266,521 | 11/1993 | Lee et al. | 437/194 |
| 5,360,524 | 11/1994 | Hendel et al. | 204/192.25 |
| 5,409,862 | 4/1995 | Wada et al. | 437/194 |

FOREIGN PATENT DOCUMENTS

| 0488264 | 6/1992 | European Pat. Off. | 204/192.17 |
| 0488264A3 | 6/1992 | European Pat. Off. | 204/192.17 |
| 62-69534 | 3/1987 | Japan . | |
| 63-19840 | 1/1988 | Japan . | |
| 1-230253 | 9/1989 | Japan . | |
| 1-258444 | 10/1989 | Japan . | |
| 2-20044 | 1/1990 | Japan . | |
| 2-32543 | 2/1990 | Japan . | |
| 3-65013 | 10/1991 | Japan . | |

OTHER PUBLICATIONS

Smith et al. "The Influence of bias sputtering and wafer preheating on the step coverage of sputtered aluminum" Thin Solid Films, 96 (1982) 291–299 Oct.

*Primary Examiner*—Nam Nguyen
*Assistant Examiner*—Rodney G. McDonald
*Attorney, Agent, or Firm*—Oblon, Spivak, McClelland, Maier & Neustadt, P.C.

[57] ABSTRACT

A wiring forming method includes a step of forming an oxide film on a silicon substrate, a step of forming a connection hole whose aspect ratio is larger than 1 in the insulation film, a step of forming an Al wiring film on the entire surface by the bias sputtering method and heating the silicon substrate to cause Al wiring film to flow into and fill the connection hole, and a step of processing Al wiring film to form an Al wiring.

6 Claims, 7 Drawing Sheets

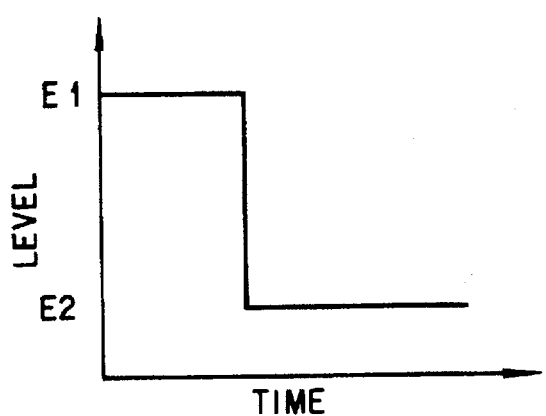
F I G. 5A
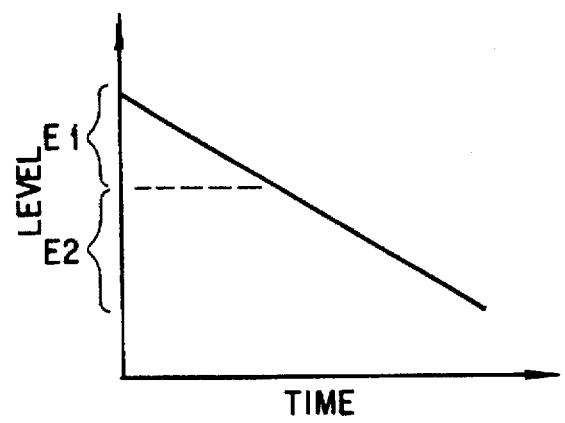
F I G. 5B
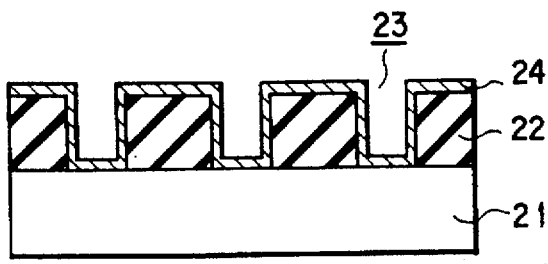
F I G. 6A
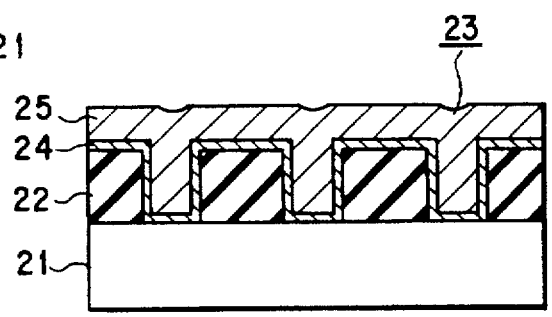
F I G. 6C
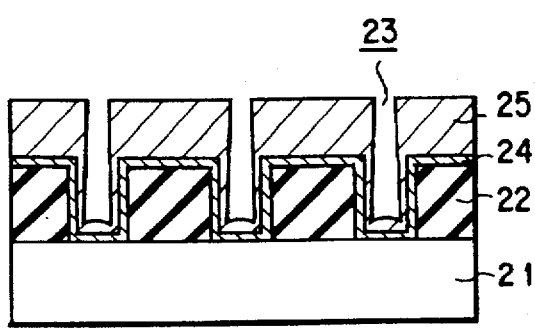
F I G. 6B

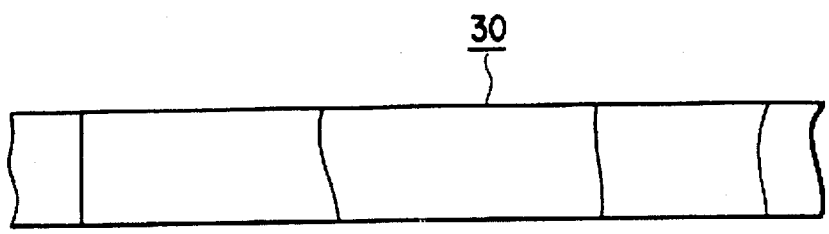
F I G. 9A
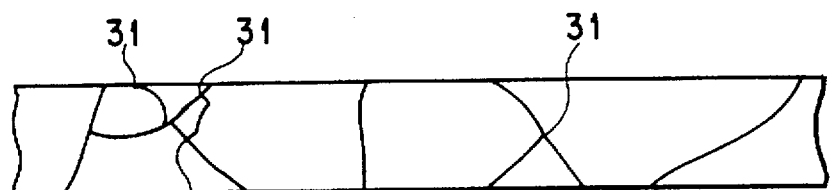
F I G. 9B
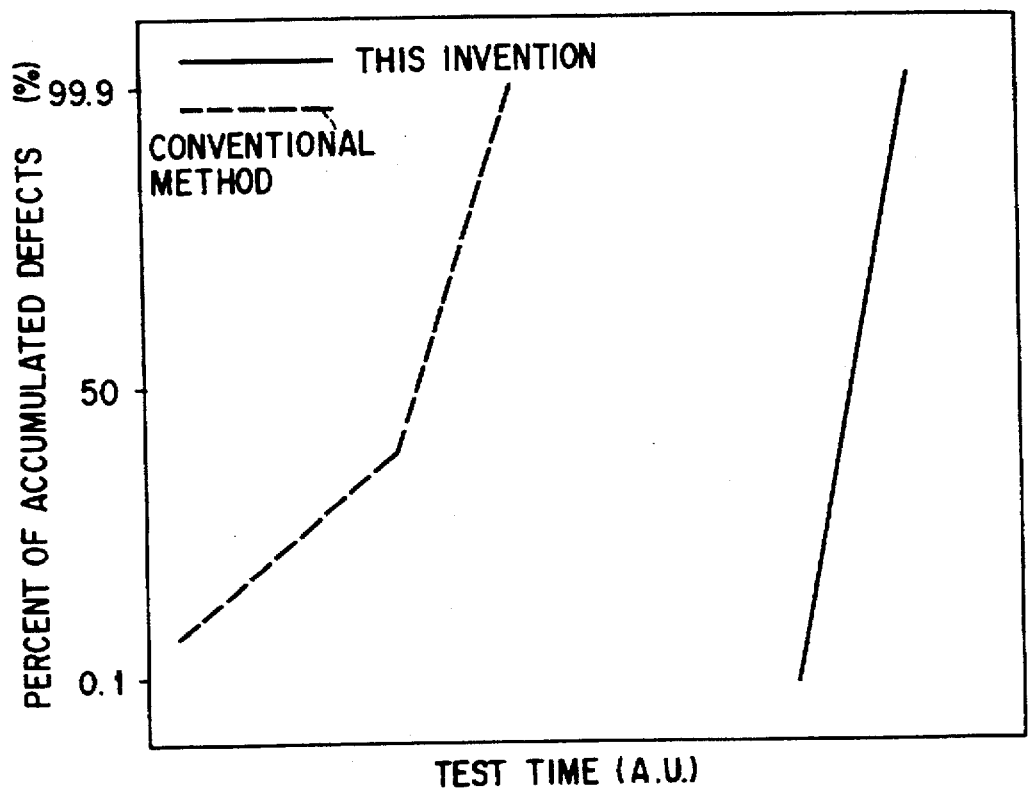
F I G. 10

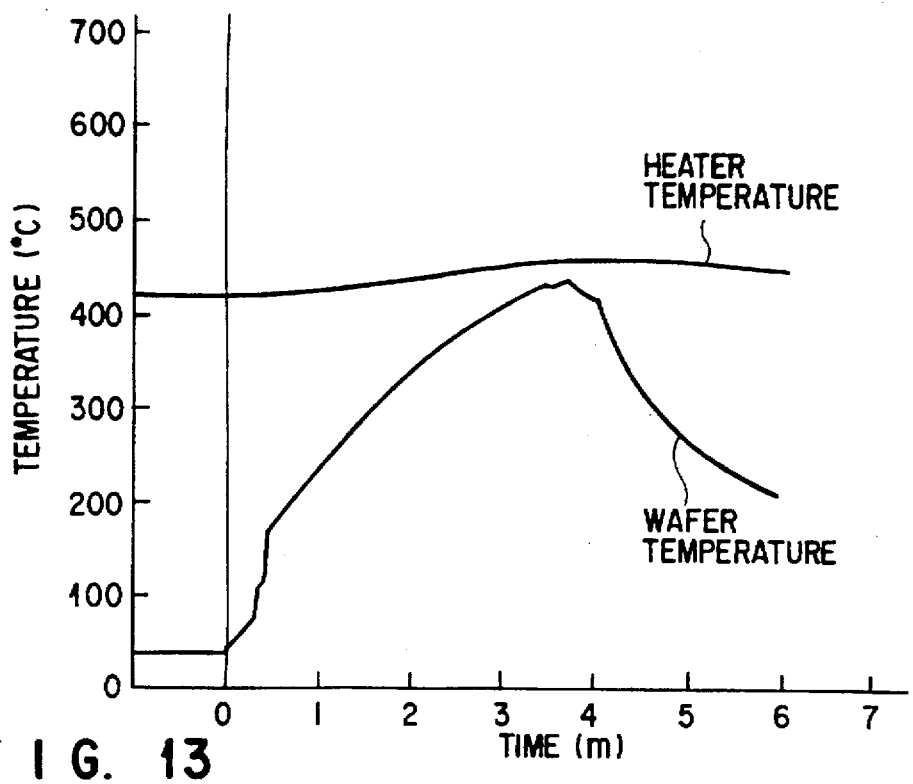
F I G. 13
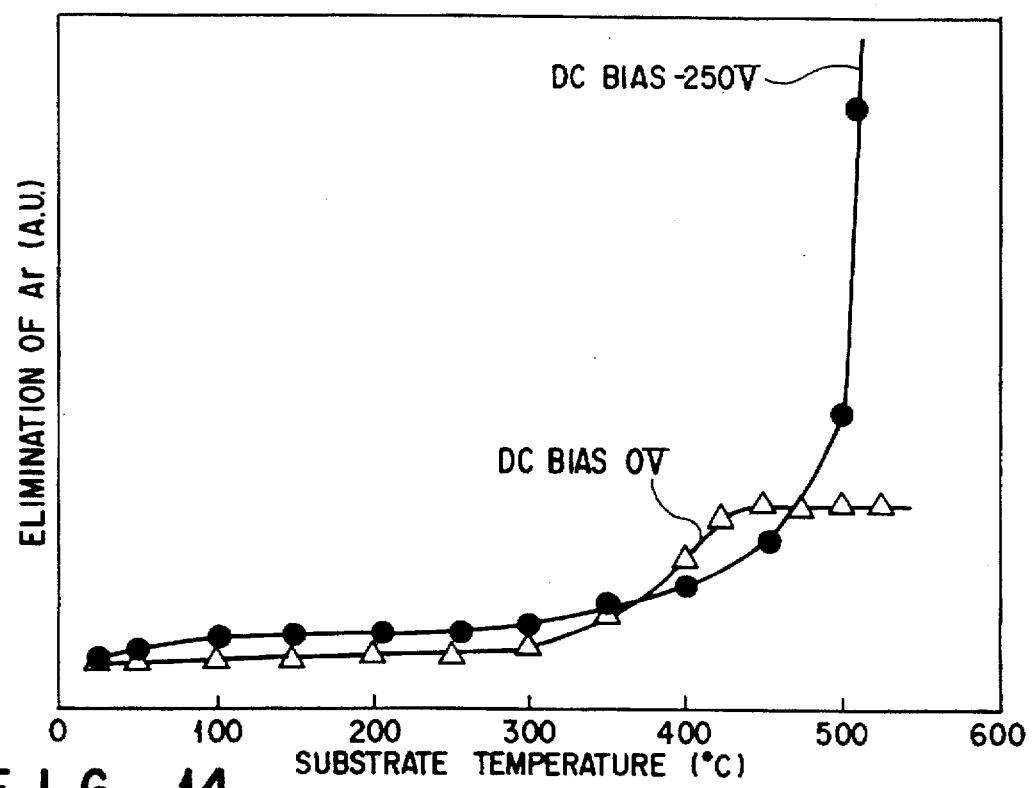
F I G. 14

WIRING FORMING METHOD

This application is a Continuation of application Ser. No. 08/341,142, filed on Nov. 16, 1994, now abandoned.

BACKGROUND OF THE INVENTION

1. Field of the Invention

This invention relates to a wiring forming method, and more particularly to a wiring forming method for forming a wiring in a connection hole having an aspect ratio larger than 1.

2. Description of the Related Art

In recent years, a large-scale integrated circuit (LSI) having a large number of transistors and resistors connected to complete an electric circuit and integrated on one chip is frequently used in an important portion of a computer or communication device. The element function of the LSI has been improved by increasing the integration density thereof. As the integration density is increased, the wirings are miniaturized and it becomes necessary to form the wirings in a multi-layered structure. In order to realize the multi-layered wiring structure, it is necessary to electrically connect a lower-level wiring layer (or element active layer) and an upper-level layer with each other via connection holes formed in an inter-level insulation film.

As the wiring material, aluminum (Al) is widely used in the prior art. This is because Al is a low-resistance material and can be easily formed in a wiring form. As a method for forming an Al film, the sputtering method is used. This is because the composition control effected at the time of film formation of an Al alloy film such as Al—Si—Cu or Al—Cu is easy, the film thickness and film quality can be made uniform for a silicon substrate with large diameter, and it is excellent in mass production. Further, recent improvement in the evacuating characteristic makes it possible to suppress degradation of the film quality by the residual gas. In addition, it becomes possible to improve the film quality by increasing the film formation speed by use of a method (magnetron sputtering method) for concentrating the plasma density by disposing magnets with opposite polarities on the rear side of the cathode. As another Al film formation method, the chemical vapor deposition (CVD) method is studied, but at present, it still remains on the study level from the viewpoint of problems of the controllability of the film quality and the mass production.

However, the method for forming an Al wiring or Al alloy wiring (which is hereinafter simply referred to as an Al wiring) by the conventional sputtering method has the following problems.

The aspect ratio of a connection hole (the depth of the connection hole/the opening diameter of the connection hole) for connecting the lower-level Al wiring to the upper-level Al wiring becomes larger with the formation of elements of greater miniaturization and of higher integration density. Generally, in the sputtering method, the step coverage of the connection hole is significantly lowered as the aspect ratio becomes larger. This is because the range of angle (viewing angle) at which Al used as wiring metal particles can be made incident is narrower in the bottom portion of the stepped portion than in the flat portion thereof. As the aspect ratio becomes larger, the viewing angle becomes smaller and Al becomes difficult to reach the bottom portion of the stepped portion, thereby degrading the step coverage. Further, as the deposition of Al progresses, the viewing angle tends to be smaller.

Therefore, when the miniaturization of elements is further enhanced and the aspect ratio of the connection hole becomes larger than 1, breakage of the AL wiring at the bottom portion of the connection hole tends to occur in the conventional sputtering method and the Al wiring for completely covering the entire internal surface (side surface and bottom surface) of the connection hole cannot be formed.

Further, even when an Al film (which is hereinafter referred to as an Al wiring film) used for forming an Al wiring is made thick in order to prevent breakage of the wiring at the stepped portion, the Al wiring for completely covering the entire internal surface of the connection hole cannot be formed since the viewing angle becomes smaller with an increase in the film thickness. Further, if the film thickness (the height of the wiring) is increased, a problem that it becomes difficult to make flat an inter-level insulating film to be formed in the later step occurs.

As the means for solving the above problem, the tungsten (W) plug technique is known. The technique is to form an Al wiring after selectively filling W into the connection hole.

As the selective filling technique of W, two methods, that is, selective CVD method and uniform CVD method are used. The selective CVD method utilizes the property that a mixture of $WF_6$ (tungsten hexafluoride) and $SiH_4$ (silane) thermally reacts only on the metal or semiconductor surface and can be effected only under the predetermined thermal reaction condition.

On the other hand, the uniform CVD method is effected under the thermal reaction condition different from that of the selective CVD method to form a W film with a uniform film thickness on the entire surface of the substrate. In this case, since an unnecessary W film is formed on the insulating film having the connection hole formed therein, it becomes necessary to remove the unnecessary W film in the later step. At present, in order to remove the unnecessary W film, a method (etch back method) for etching the entire surface of the substrate by use of the reactive ion etching (RIE) method is used.

However, the W plug technique has the following problems.

The first problem is related to the contact resistance. That is, since the resistivity of W is higher than that of Al, the resistance of the wiring becomes larger to degrade the element function. Another problem is the reliability. A current flows in the wiring, the current density becomes extremely larger in the fine wiring, and if the extremely large current density is maintained in the wiring, metal atoms in the wiring start to move from the cathode to the anode by collision with a large amount of electrons. This is a phenomenon called electromigration (EM), the mobility of metal atoms depends on the type of metal, and it is smaller in W than in Al.

For this reason, when the wiring is formed by a series connection of different metals of Al/W/Al as in a W plug, discontinuity occurs in the flow of the metal atoms. Therefore, Al atoms are accumulated on the cathode side of the W plug and depletion of the Al atoms occurs on the anode side.

The accumulation and depletion of the Al atoms may cause hillock or void of the wiring to short-circuit the wirings or break the wiring, thereby lowering the reliability of the wiring.

Further, the CVD method for forming the W plug has many problems. That is, in the case of selective CVD method, since the reaction occurring only under the particular condition is used, the margin in the manufacturing process is small, the controllability of the film quality is low, and the pre-processing for causing stable occurrence of the reaction is required to increase the number of steps. Further, in the case of uniform CVD method, it is necessary to remove an unnecessary W film in the later step and the number of steps is increased.

In addition to the above W plug, a method for directly filling Al on the inner wall of the connection hole by use of the bias sputtering method is studied and reported. The bias sputtering method is a film formation technique for applying a negative voltage to the substrate, striking positive ions of a sputtering gas such as argon into the substrate during the formation of the Al film to subject the Al film to the re-sputtering process so as to prevent reduction in the viewing angle and attach the Al atoms subjected to the re-sputtering process to the inner wall of the connection hole, thus improving the step coverage. In the case of the bias sputtering method, it is possible in many cases to combine an additional condition such as a condition of simultaneously effecting the substrate heating and Al can be directly filled into the connection hole with the surface kept flat.

However, the bias sputtering method has the following problems. That is, a large amount of Ar atoms are trapped in the Al film during the formation of the Al film, thereby degrading the film quality (it is difficult to increase the grain size) and lowering the reliability. Further, the Al wiring film must be made thick in order to fill the connection hole, and an additional problem that a method for uniformly filling a gap between the thick Al wirings with an inter-level insulation film with flatness.

SUMMARY OF THE INVENTION

An object of this invention is to provide a wiring forming method capable of forming a wiring with high reliability even when the aspect ratio of a connection hole is larger than 1.

In order to attain the above object, a first wiring forming method (claim 1) of this invention comprises a step of forming an insulation film on a substrate; a step of forming a connection hole whose aspect ratio is larger than 1 in the insulation film; a step of forming a conductive film on the surface of the insulation film and in the connection hole by the bias sputtering method and heating the substrate to cause the conductive film to flow into and fill the connection hole; and a step of processing the conductive film to form a wiring.

In this case, the operation of filling the conductive film is preferably effected at the same time as or after formation of the conductive film.

A second wiring forming method (claim 2) of this invention comprises a step of forming an insulation film on a substrate; a step of forming a connection hole whose aspect ratio is larger than 1 in the insulation film; a step of forming a conductive film having sputtering gas introduced therein on the surface of the insulation film and in the connection hole by the bias sputtering method and heating the substrate to a temperature at which the sputtering gas is not driven out of the conductive film to cause the conductive film to flow into and fill the connection hole; a step of processing the conductive film to form a wiring; and a step of heating the substrate to a temperature at which the sputtering gas is driven out of the conductive film to discharge the sputtering gas from the conductive film before or after the wiring is formed.

In this case, the operation of filling the conductive film is preferably effected at the same time as or after formation of the conductive film.

Further, the conductive film having sputtering gas introduced therein can be easily formed by adjusting the voltage applied to the substrate and the substrate temperature.

A third wiring forming method (claim 3) of this invention comprises a step of forming an insulation film on a substrate; a step of forming a connection hole whose aspect ratio is larger than 1 in the insulation film; a step of forming a conductive film on the insulation film and in the connection hole by the sputtering method; a step of covering the entire internal surface of the connection hole with the conductive film by exposing the substrate to plasma to subject the surface of the conductive film to the sputter-etching and heating the substrate to cause the conductive film to flow into and fill the connection hole; and a step of processing the conductive film to form a wiring.

In this case, the operation of filling the conductive film is preferably effected at the same time as or after formation of the conductive film.

A fourth wiring forming method (claim 4) of this invention comprises a step of forming an insulation film on a substrate; a step of forming a connection hole whose aspect ratio is larger than 1 in the insulation film; a step of forming a conductive film on the insulation film and in the connection hole by the sputtering method; a step of covering the entire internal surface of the connection hole with the conductive film without heating the substrate by applying charged particles having first ion energy to the conductive film to subject the surface of the conductive film to the sputter-etching; a step of applying charged particles having second ion energy smaller than the first ion energy to the conductive film and heating the substrate to cause the conductive film to flow into and fill the connection hole; and a step of processing the conductive film to form a wiring.

In this case, a variation from the first ion energy E1 to the second ion energy E2 may be intermittent as shown in FIG. 5A or may be continuous as shown in FIG. 5B.

The operation of heating the substrate in the filling step may be effected while the charged particles (first charged particles) having the first ion energy are being applied, immediately after the first charged particles are applied, or while the first charged particles having the second ion energy are being applied.

A fifth wiring forming method (claim 5) of this invention comprises a step of forming an insulation film on a substrate; a step of forming a connection hole whose aspect ratio is larger than 1 in the insulation film; a step of forming a conductive film whose minimum film thickness on the internal surface of the connection hole is equal or more than 20 nm on the surface of the insulation film and in the connection hole and heating the substrate to cause the conductive film to flow into and fill the connection hole; and a step of processing the conductive film to form a wiring.

In this case, the operation of filling the conductive film is preferably effected at the same time as or after formation of the conductive film.

A sixth wiring forming method (claim 6) of this invention comprises a step of forming an insulation film on a substrate; a step of forming a connection hole whose aspect ratio is larger than 1 and which is formed in a tapered form to spread towards the open end in the insulation film; a step of forming a conductive film whose minimum film thickness on the internal surface of the connection hole is equal or more than 20 nm on the surface of the insulation film and in the connection hole by the anisotropic sputtering method and heating the substrate to cause the conductive film to flow into and fill the connection hole; and a step of processing the conductive film to form a wiring.

In this case, the operation of filling the conductive film is preferably effected at the same time as or after formation of the conductive film.

Further, the tapering angle of the connection hole in the tapered form is preferably set in the range of 80° to 85°.

An seventh wiring forming method (claim 7) of this invention comprises a step of forming an insulation film on a substrate; a step of forming a connection hole whose aspect ratio is larger than 1 in the insulation film; a step of forming a conductive covering film on the entire surface of the insulation film; a step of removing gas adsorbed at least on the surface of the conductive covering film; a step of forming a conductive film on the surface of the insulation film and in the connection hole and heating the substrate to cause the conductive film to flow into and fill the connection hole; and a step of processing the conductive film to form a wiring.

In this case, the operation of filling the conductive film is preferably effected at the same time as or after formation of the conductive film.

A eighth wiring forming method (claim 8) of this invention is characterized by applying charged particles to the conductive film to accelerate the diffusion of atoms in a surface layer of the conductive film without subjecting the conductive film to the sputter-etching at the time of heating the substrate in the filling step in the above invention (claim 1).

A ninth wiring forming method (claim 22) of this invention is characterized in that the gas removing operation is effected by irradiation of charged particles or application of ultraviolet rays in the above invention (claim 7).

A tenth wiring forming method (claim 23) of this invention is characterized by cooling the substrate after the gas removing operation and before formation of the conductive film in the above invention (claim 7).

An eleventh wiring forming method (claim 9) of this invention is characterized by removing gas adsorbed at least on the side portion and bottom portion of the connection hole before formation of the conductive film in the above invention (claims 1).

A twelfth wiring forming method (claim 24) of this invention comprises a step of forming an insulating film on a substrate; a step of forming a conductive polycrystalline film on the insulating film; a step of processing said conductive film, to form a wiring; and a step of subjecting the conductive film to a temperature-raising and -lowering process, repeatedly at least two times, before or after the wiring is formed.

According to the first wiring forming method (claim 1) of this invention, the side portion and bottom portion of the connection hole having an aspect ratio larger than 1 can be stably covered with a thick conductive film since the bias sputtering method is used.

Therefore, even if the substrate is heated, aggregation of the conductive film on the side portion and bottom portion of the connection hole does not occur and the movement of atoms constituting the conductive film is achieved via the conductive film formed on the internal surface of the connection hole by heating the substrate.

Therefore, even when the aspect ratio of the connection hole exceeds 1 and even if a particular material is not used as the under layer material, occurrence of the breakage of the wiring at the bottom portion of the connection hole and occurrence of void in the internal portion of the connection hole can be prevented.

Further, since the film thickness of the conductive film in an area other than the connection hole can be made small, an additional problem that it becomes difficult to attain the flatness of an inter-level insulation film to be formed in the later step does not occur.

Further, since the wiring is not formed by a series connection of different metals of Al/W/Al unlike the case of the W plug, an increase in the number of steps can be prevented, no interruption occurs in the flow of atoms, and degradation in the EM resistance can be prevented. In addition, since a thick conductive film can be formed on the internal surface of the connection hole even if the aspect ratio exceeds 1, degradation in the SM resistance can be prevented.

Further, according to the second wiring forming method (claim 2) of this invention, the following operation and effect can be attained in addition to the same operation and effect as those attained in the above invention (claim 1).

That is, according to this invention, since the conductive film having sputtering gas introduced therein is formed, the movement of the conductive film can be attained at lower temperatures than in the case where a conductive film having no sputtering gas introduced therein is used. Therefore, agglomeration of the conductive film on the side portion and bottom portion of the connection hole can be further suppressed and a wiring can be formed in a connection hole which has a larger aspect ratio.

Since the sputtering gas contained in the conductive film or wiring can be removed or eliminated from the conductive film or wiring by heating the substrate before or after formation of the wiring, a problem that the crystal grain size cannot be increased can be solved. Therefore, degradation of the wiring by the sputtering gas can be prevented.

Further, according to the third wiring forming method (claim 3) of this invention, after the conductive film is formed on the substrate by the sputtering method, the substrate is exposed to plasma to sputter and etch the surface of the conductive film.

Therefore, atoms constituting the conductive film subjected to the sputter-etching are attached to the internal surface of the connection hole again so that the side portion and bottom portion of the connection hole having an aspect ratio larger than 1 can be stably covered with the thick conductive film.

As a result, the same operation and effect as those attained in the first wiring forming method (claim 1) of this invention can be attained and the conductive film can be formed without using the bias sputtering method, thereby making it possible to further improve the film quality.

Further, according to the fourth wiring forming method (claim 4) of this invention, after the conductive film is formed on the substrate by the sputtering method, the surface of the conductive film is subjected to the sputter-etching by charged particles (first charged particles) having first ion energy so as to attain the same operation and effect as those attained in the third wiring forming method (claim 3) of this invention.

Further, according to this invention, the following operation and effect can be attained.

In this invention, the conductive film is moved and filled into the connection hole by applying charged particles (second charged particles) having second ion energy to the conductive film and heating the conductive film.

At this time, since the second ion energy is smaller than the first ion energy, the second charged particles accelerate the diffusion of atoms of the surface of the conductive film without subjecting the conductive film to the sputter-etching.

Therefore, according to this invention, the conductive film can be filled into the connection hole by heating the substrate to temperatures lower than in the case of the third wiring forming method (claim 3) of this invention.

According to the studies by the inventor of this application and others, it is found that no breakage of the wiring in the internal portion of the connection hole occurs if the conductive film whose minimum film thickness on the internal surface of the connection hole is not less than 20 nm is formed on the entire surface and then the substrate is heated.

Therefore, according to the fifth and sixth wiring forming methods (claim 5, claim 6) of this invention based on the above knowledge, degradation in the reliability of the wiring by the breakage of the wiring on the bottom portion of the connection hole can be prevented.

Further, according to the seventh wiring forming methods (claim 7) of this invention, since the conductive covering film (for example, barrier metal) is formed on the internal surface of the connection hole before formation of the conductive film, the conductive film will not be formed in direct contact with the insulation film, and therefore, the operation and effect of preventing a bad influence (for example, atoms in the conductive film are diffused into the element active layer by heating the substrate in the later step) given by the conductive film to the element active layer can be attained in addition to the operation and effect obtained in the above invention.

Further, according to the studies by the inventor of this application and others, it is found that agglomeration of the conductive film on the inner wall of the connection hole can be prevented by removing adsorbed gas.

Therefore, according to this invention (claim it becomes possible to move and fill the conductive film into the connection hole.

Further, according to the eighth wiring forming methods (claim 8) of this invention, since the diffusion of atoms in a surface layer of the conductive film is accelerated by charged particles without subjecting the conductive film to the sputter-etching, the conductive film can be filled into the connection hole by low-temperature heating of the substrate as in the case of the fourth wiring forming methods (claim 4) of this invention.

Further, according to the eleventh wiring forming methods (claim 9) of this invention, since gas adsorbed on the side portion and bottom portion of the connection hole is removed, the conductive film can be easily moved and filled into the connection hole as in the case of the seventh wiring forming methods (claim 7) of this invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are diagrams showing the relation between the first ion energy and the second ion energy;

FIGS. 6A to 6C are cross sectional views showing the steps of a process for forming an Al wiring according to a second embodiment of this invention;

FIGS. 9A and 9B are cross sectional views of wirings for illustrating the grain boundary which is subjected to the heat treatment of this invention and that of the conventional case;

FIG. 10 is a characteristic diagram showing the distribution of wiring service life of an Al wiring which is subjected to the heat treatment of this invention and that of the conventional case;

FIG. 13 is a diagram showing the temperature profile of a silicon substrate; and FIG. 14 is a characteristic diagram showing the relation between the substrate temperature and the amount of Ar discharged from the Al wiring film containing Ar gas.

DETAILED DESCRIPTION OF THE PREFERRED EMBODIMENTS

There will now be described an embodiment of this invention with reference to the accompanying drawings.

(Embodiment 1)

FIGS. 1A to 1E are cross sectional views showing the steps of a process for forming an Al wiring according to a first embodiment of this invention.

Figure 1C:
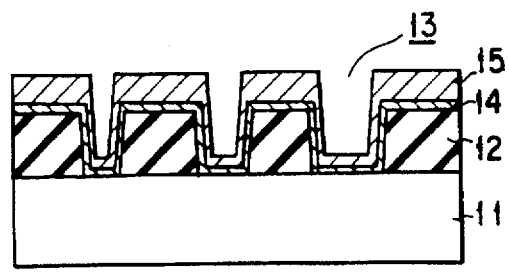
FIGS. 1A to 1E are cross sectional views showing the steps of a process for forming an Al wiring according to a first embodiment of this invention.
Figure 1A:
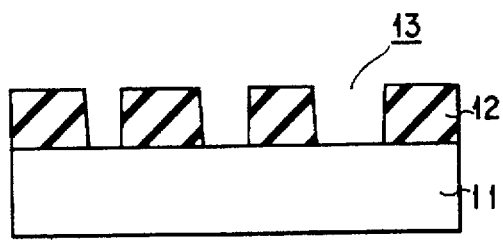

First, as shown in FIG. 1A, an oxide film 12 with a thickness of 0.8 μm is formed on a silicon substrate 11 formed of single crystal silicon and having a plane orientation (100) by the plasma CVD method. Then, connection holes 13 having an opening diameter of 0.3 to 1.0 μm and an aspect ratio larger than 1 are formed in the oxide film 12 which is formed on a wiring layer or element active layer (not shown) formed on the silicon substrate 11 by the photolithography method and RIE method.

In this case, for example, the condition for the RIE method is set such that a mixture of $CF_4$ and $H_2$ is used as the etching gas, the pressure set at the time of etching is controlled to 40 mTorr, and the electric power used at the time of etching is set to 800 W. When the connection hole 13 is formed under the above condition, the tapering angle thereof is set within the angle range of 80° to 90°.

After this, a resist used for formation of the connection holes 13 is subjected to the ashing process in the oxygen plasma and then washed out in a mixed liquid of sulfuric acid and hydrogen peroxide.

Figure 1D:
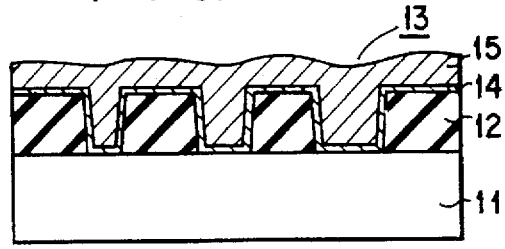
Figure 1B:
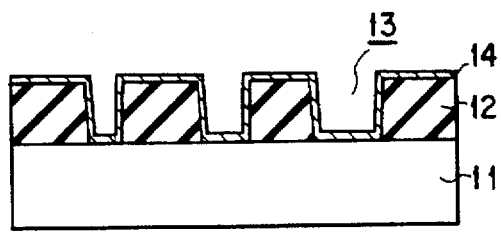

Next, as shown in FIG. 1B, a laminated film 14 of Ti film and TiN film is formed on the entire surface by the DC magnetron sputtering method. For example, the film thicknesses of the Ti film and TiN film are respectively set to 20 nm and 70 nm. Then, the substrate 11 having the above structure formed thereon is subjected to the heat treatment in an $N_2$ normal pressure atmosphere, at a temperature of 600° C., and for 30 minutes in an electric furnace.

The laminated film of Ti film and TiN film is formed as follows, for example.

That is, a Ti film is first formed by using a Ti target of 99.9999%, introducing Ar at a flow rate of 40 sccm and supplying an application current of 0.5 A.

After this, a TiN film is formed in a film formation chamber different from that for the Ti film. At this time, it is continuously formed in a vacuum atmosphere without exposing the Ti film to the atmospheric air. In this case, a Ti target of 99.9999% is used as a target like the case of formation of the Ti film, and a TiN film is formed by the formation sputtering method by mixing Ar at the flow rate of 20 sccm with $N_2$ at the flow rate of 20 sccm and supplying an application current of 1 A.

The attainable degree of vacuum in each of the film formation chambers is of the order of $10^{-5}$ Pa, for example, and the pressure in the sputtering process is set to $2.7 \times 10^{-1}$ Pa, for example.

Next, as shown in FIG. 1C, an Al wiring film 15 is formed on the entire surface without heating by the DC magnetron sputtering method while a DC voltage of −100 V to −250 V, for example, is being applied to the silicon substrate 11. At this time, the minimum film thickness of the Al wiring film 15 in the connection hole 13 is set to 20 nm or more.

Figure 2:
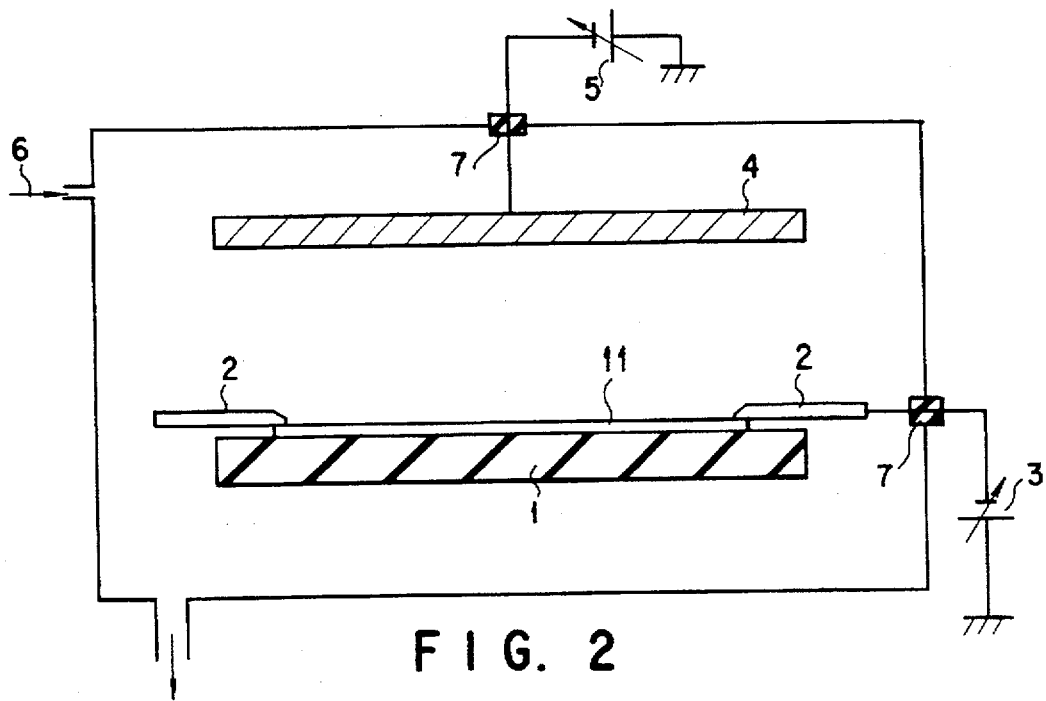
FIG. 2 is a schematic view showing the schematic structure of a DC magnetron sputtering device.

Specifically, for example, as shown in FIG. 2, the silicon substrate 11 is disposed on a supporting table 1 formed of insulation material, the peripheral portion of the silicon substrate 11 is fixed by a clamp 2, and a DC voltage is applied to the clamp 2 by use of a variable DC voltage source 3 so as to apply a DC voltage to the silicon substrate 11, an electric power of 10 kW is supplied to a sputtering target 4 obtained by adding Si of 1 weight % and Cu of 0.5 weight % to Al with the purity of 99.9999% by use of a variable DC voltage source 5, Ar 6 which is used as sputtering gas is introduced, and the base pressure is set to $10^{-6}$ Pa to form an Al wiring film 15 with a thickness of 0.4 μm.

The wiring film formed by the sputtering contains Si and Cu in addition to Al, but is simply referred to as an Al wiring film (this is also applied in the other embodiments). In FIG. 2, a reference numeral 7 denotes an insulation material. It is also possible to use the bias sputtering method in which an AC voltage is applied to the silicon substrate 11.

Further, the Ar gas is trapped in the Al wiring film being formed by the bias sputtering method, due to the application of the negative bias voltage (substrate voltage). Since the bias sputtering method is effected without baking the substrate, the substrate temperature does not rise so much as to discharge the Ar gas from the Al wiring film. Therefore, the Ar gas would not be discharged from the Al wiring film while the film is being formed.

Next, after the silicon substrate 11 is fed into the heating chamber without exposing the same to the atmospheric air, the silicon substrate 11 is heated for approx. 3 minutes in the same vacuum as that of the sputtering to fill the Al wiring film 15 into the connection hole 13 as shown in FIG. 1D.

At this time, the temperature of the silicon substrate is set below 500° C., and as the method for heating the silicon substrate 11, a method for placing and fixing the silicon substrate 11 on a ceramic heater which is previously heated to 420° C. by use of an electrostatic chuck is used, for example. The attainable temperature of the silicon substrate 11 by the above heating method is approx. 440° C.

Next, the substrate temperature is raised to 520° C. without exposing the silicon substrate 11 to the atmospheric air and the substrate 11 is heated for approx. 10 minutes to discharge Ar gas contained in the Al wiring film.

Figure 1E:
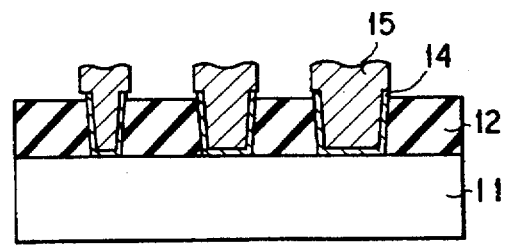

Finally, as shown in FIG. 1E, the laminated layer 14 and Al wiring film 15 are patterned by use of the light exposing method and RIE method to complete an Al wiring.

Figures 3A, 3B:
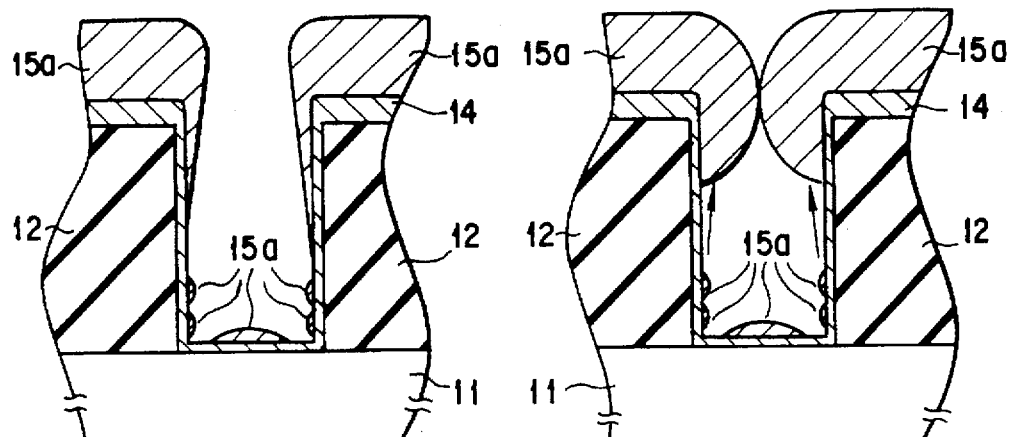
FIGS. 3A to 3C are views showing the state in which the Al wiring film is buried by the conventional method.
Figures 3C, 4A:
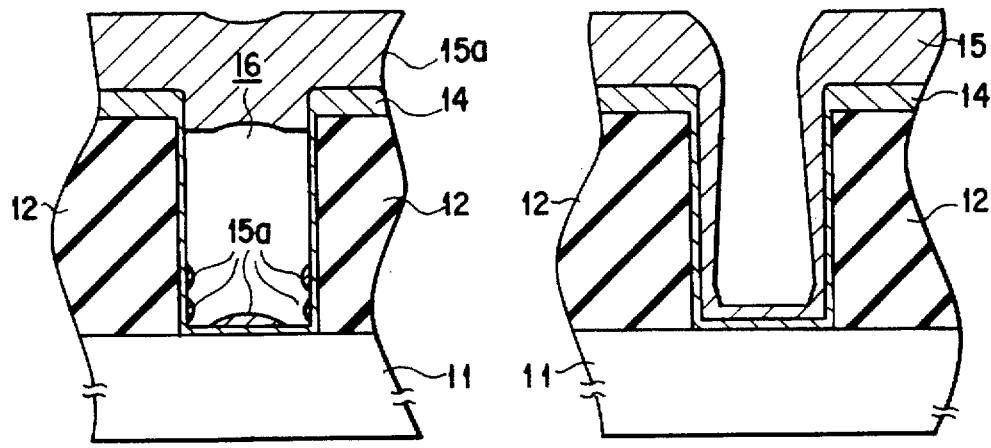
FIGS. 4A to 4C are views showing the state in which the Al wiring film is buried by the method of the first embodiment.
Figures 4B, 4C:
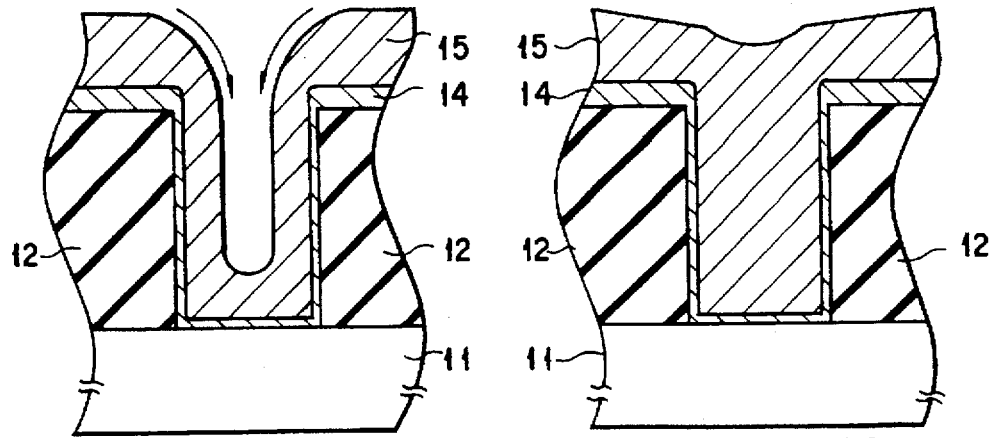

It is possible to discharge Ar gas after formation of the Al wiring. In this case, since the Al wiring has a small area-to-volume ratio, the Ar discharging operation can be effected more effectively. FIGS. 3A to 3C are views showing the state in which the Al wiring film is buried by use of the conventional method (without applying a substrate voltage). FIGS. 4A to 4C are views showing the state in which the Al wiring film is buried by the film formation method of this embodiment. In this case, the opening diameter of the connection hole is 0.5 μm and the aspect ratio thereof is 1.6.

In the case of the conventional method, an Al wiring film 15a cannot cover the entire inner wall of the connection hole in a film form because of low step coverage and, as shown in FIG. 3A, the Al wiring film 15a of island form is formed on the bottom of the connection hole. That is, breakage of the wiring at the stepped portion occurs.

If the silicon substrate 11 on which the Al wiring film 15a having a form obtained at the initial stage of film formation is subjected to the heating treatment at the attainable temperature of 440° C. for 3 minutes, agglomeration of the Al wiring film 15a occurs as shown in FIG. 3B, making it impossible to fill the Al wiring film into the connection hole.

Particularly, when the opening diameter is made small, opposing portions of the Al wiring film 15a which are agglomerated and project upwardly of the connection hole are brought into close contact with each other as shown in FIG. 3C to provide a structure which is stable in the surface energy, and a void 16 is formed in the connection hole, making it impossible to fill the connection hole in the later step.

On the other hand, in the case of this embodiment, a reduction in the viewing angle of incident Al atoms can be suppressed by the re-sputtering of the Al wiring film 15 by Ar ions trapped therein by the substrate voltage, and since the re-sputtered Al atoms are attached again to the internal surface of the connection hole, the thick Al wiring film 15 can be formed on the entire internal surface of the connection hole as shown in FIG. 4A. That is, unlike the conventional case, breakage of the wiring at the stepped portion will not occur.

There is a relation between the film thickness of the Al wiring film and the agglomeration temperature and the agglomeration temperature becomes lower as the film thickness becomes thinner. However, it was found that if the sputtering was effected while a voltage was being applied to the silicon substrate 11 as in this embodiment, a sufficiently thick Al wiring film was formed on the internal surface of the connection hole and no agglomeration occurred even when the heat treatment of attainable temperature of 440° C. for 3 minutes was effected. Therefore, Al atoms of the Al wiring film 15 move in the surface or internal portion of the Al wiring film 15 formed on the internal surface of the connection hole as shown in FIG. 4B and can be transferred into the state of low surface energy, and the Al wiring film 15 can be filled into the connection hole without forming a void as shown in FIG. 4C.

FIG. 14 is a characteristic diagram showing the relation between the substrate temperature and the amount of Ar discharged from the Al wiring film containing Ar gas. It is understood from FIG. 14 that Ar gas in the Al wiring film is discharged from the Al wiring film when the substrate temperature becomes equal to or higher than approx. 500° C.

Therefore, the fluidity of the Al wiring film containing Ar gas is high, the Al wiring film can be filled into the connection hole even when the substrate temperature is as low as 500° C. or less as in this embodiment.

However, after completion of the filling of the Al wiring film into the connection hole, Ar gas in the Al wiring film obstructs the growth of crystal grains, thereby causing degradation in the reliability.

Therefore, degradation in the reliability caused by Ar gas can be prevented by raising the substrate temperature to 500 or higher to discharge the Ar gas in the Al wiring film to the exterior as in this embodiment.

As described above, according to this embodiment, the thick Al wiring film 15 can be formed to stably cover the side portion and bottom portion of the connection hole 13 whose aspect ratio is larger than 1 since the bias sputtering method is used. Therefore, even if the silicon substrate 11 is heated, agglomeration of the Al wiring film 15 will not occur and Al atoms constituting the Al wiring film 15 are moved through the Al wiring film 15 formed on the internal surface of the connection hole 13 by the heating of the silicon substrate 11. As a result, breakage of the wiring at the stepped portion and occurrence of the void can be prevented, thereby enhancing the reliability of the wiring.

Further, since a portion of the Al wiring film 15 formed in an area other than the connection hole 13 can be made thin, a problem that it becomes difficult to make flat an inter-level insulation film formed in the later step will not occur.

In addition, since the wiring is not formed by a series connection of different metals of Al/W/Al unlike the case of the W plug, an increase in the number of steps can be prevented, no interruption occurs in the flow of atoms, and degradation in the EM resistance can be prevented. Further, since the thick conductive film 15 can be formed on the internal surface of the connection hole 13 even if the aspect ratio thereof exceeds 1.

A temperature profile of a silicon substrate obtained by the heat treatment effected in this embodiment is shown in FIG. 13. It was confirmed that the connection hole could be filled with an Al wiring film with a thickness of 0.4 µm if the aspect ratio thereof was up to 1.8 in a case where the silicon substrate was heated according to the above temperature profile.

(Embodiment 2)

FIGS. 6A to 6C are cross sectional views showing the steps of a process for forming an Al wiring according to a second embodiment of this invention.

First, as shown in FIG. 6A, an insulation film 22 having connection holes 23 whose aspect ratio is larger than 1 is formed on a silicon substrate 21 in the same manner as in the former embodiment, and then, a laminated film 24 of Ti film and TiN film is formed on the entire surface.

Next, as shown in FIG. 6B, an Al wiring film 25 with a thickness of 0.6 µm is formed on the laminated film 24 without heating by use of the DC magnetron sputtering method.

After this, the silicon substrate 21 is fed onto a ceramic heater which is previously heated to 200° C. and fixed thereon. At the same time of fixation of the silicon substrate, an RF power of 100 W with a frequency of 13.56 MHz is applied to the substrate side to cause plasma discharge. The attainable degree of vacuum of a processing chamber into which the silicon substrate 21 is received is of the order of $10^{-6}$ Pa, and Ar is previously introduced into the processing chamber at a flow rate of 55 sccm to maintain the pressure at 0.8 Pa.

Since the surface of the Al wiring film 25 is struck by Ar ions created by the plasma discharge, the surface of the Al wiring film 25 is etched by 0.2 µm and the silicon substrate 21 is heated. As a result, a thick Al wiring film 25 is formed on the side portion and bottom portion of the connection hole, and as shown in FIG. 6C, the substrate temperature is raised to fill the Al wiring film 25 into the connection hole 23.

In this embodiment, Ar is used as the sputtering gas, but it is possible to use atoms such as hydrogen (H) having smaller mass in order to lower the sputtering speed. Particularly, ionized hydrogen has high reducing property and is effective to remove a natural oxide film which is formed on the surface of the Al wiring film even in vacuum. Removal of the natural oxide film makes it possible to enhance diffusion of Al atoms in the surface thereof and enhance the filling efficiency.

Finally, the laminated film 24 and Al wiring film 25 are patterned in the same manner as in the former embodiment to complete the Al wiring.

According to this embodiment, since the silicon substrate 21 is exposed to plasma to subject the surface of the Al wiring film 25 to the sputter-etching after the Al wiring film 25 is formed on the silicon substrate 21 by the normal sputtering method, the side portion and bottom portion of the connection hole 23 having an aspect ratio larger than 1 can be stably covered with a thick conductive film 25 even if the bias sputtering method is not used. Therefore, the same effect as in the former embodiment can be attained. Further, since the Al wiring film 25 can be formed without using the bias sputtering method, introduction of Ar gas into the Al wiring film 25 can be suppressed, thereby enhancing the film quality.

(Embodiment 3)

Next, an Al wiring forming method according to a third embodiment of this invention is explained.

This is a method for filling an Al wiring film into a connection hole by continuously forming a wiring film on the side portion and bottom portion of the connection hole without applying a DC voltage or high frequency voltage to a silicon substrate and then heating the silicon substrate.

First, like the first embodiment, an insulation film having connection holes whose aspect ratio is larger than 1 is formed on a silicon substrate, and then, a laminated film of Ti film and TiN film is formed on the entire surface.

Next, a method for inclining and rotating the silicon substrate is used in order to form an Al wiring film which is thicker than in a case where the conventional sputtering method is used for formation on the internal surface of the connection hole.

That is, first, the silicon substrate is disposed on a stage which is set in parallel to a cathode (Al—Si—Cu target) plane. The stage can be controlled in a range of inclination angle of ±60° to the cathode plane and permits the silicon substrate on the stage to be rotated so as to attain the above-described method. Further, a distance between the cathode and the silicon substrate is 400 mm and the direction of atoms flying from the target is set in a direction perpendicular to the cathode.

Next, an Al wiring film with a thickness of 0.4 µm is formed under the condition that the inclination angle of the substrate is changed from −30° to +30° by 30 times per minute and the rotation speed of the substrate is set to 60 rpm. By this method, an Al wiring film with a thickness of approx. 50 nm can be formed on the internal surface of the connection hole when the aspect ratio of the connection hole is 1.5.

Thus, according to this embodiment, the Al wiring film can be filled in the connection hole without applying a DC voltage or high frequency voltage to the silicon substrate. As is explained in the first embodiment, this is because the entire internal surface of the connection hole is covered with the Al wiring film. That is, if the entire internal surface of the connection hole can be covered with the Al wiring film, the effect of this invention can be attained irrespective of the film formation method used for forming the Al wiring film.

The method described in the first to third embodiments is effective particularly when the depth of the connection hole is larger than the thickness of the conductive film used as a wiring.

Now, modifications of the first to third embodiments are explained below.

In the first embodiment, the Al wiring film 15 is formed by the bias sputtering method, but it is possible to form the Al wiring film 15 by use of the bias sputtering method after the Al wiring film 15 is formed to a certain thickness by the normal sputtering method in order to suppress the etching and damage of the substrate surface by the sputtering.

Further, in a case where the heating temperature of the silicon substrate 11 is set in a temperature range in which the Al wiring film 15 being formed on the internal surface of the connection hole 13 will not be agglomerated, there occurs no problem if the step of heating the silicon substrate 11 is started at the same time as or before the step of forming the Al wiring film 15.

It is preferable to heat the silicon substrate 11 after formation of the Al wiring film 15 in a state in which the silicon substrate 11 is kept from being exposed to the atmospheric air, that is, formation of a native oxide film on the surface of the Al wiring film 15 is suppressed so as to permit Al atoms to smoothly move, but there will occur no problem even if the silicon substrate 11 is heated after being exposed to the atmospheric air if no influence is given by the natural oxide film.

Further, in the second embodiment, the step of etching the surface of the Al wiring film 25 by Ar ions created by plasma discharge and the step of heating the silicon substrate 21 are effected at the same time, but the heating step may be effected after the etching step.

Further, in the first to third embodiments, there occurs no problem even if the silicon substrate is previously heated when the temperature thereof is set in a temperature range in which the Al wiring film 15 will not be aggregated at the time of formation of the Al wiring film on the silicon substrate.

(Embodiment 4)

FIGS. 11A to 11E are cross sectional views showing the steps of a process for forming an Al wiring according to a fourth embodiment of this invention.

Figure 11A:
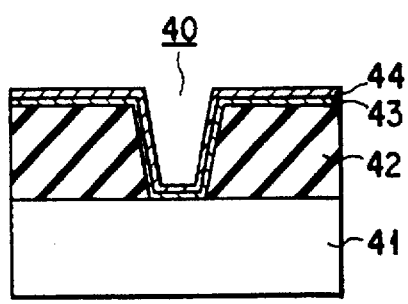
FIGS. 11A to 11E are cross sectional views showing the steps of a process for forming an Al wiring according to a fourth embodiment of this invention.

First, as shown in FIG. 11A, an $SiO_2$ film 42 with a thickness of 0.8 µm is formed on a silicon substrate 41 by the plasma CVD method using a mixture of TEOS and $O_2$ as a source. By this film formation method, the $SiO_2$ film 42 having water sufficiently reduced can be obtained. Therefore, the degassing process for the $SiO_2$ film 42 need not be performed by all means.

Then, by use of the photolithography and RIE method, a connection hole 40 having an opening diameter of 0.3 to 1.0 µm and an aspect ratio larger than 1 is formed. At this time, by adequately selecting the RIE condition, the connection hole 40 is formed in a tapered form having a tapering angle of 80° to 85°. After this, a resist used for formation of the connection hole 40 is subjected to the ashing process and washed out by use of a mixed liquid of sulfuric acid and hydrogen peroxide.

Next, a laminated film of Ti film 43 and TiN film 44 used as barrier metal (conductive protection film) is formed on the entire surface by the DC magnetron sputtering method. The film thicknesses of the Ti film 43 and TiN film 44 are respectively set to 20 nm and 70 nm, for example. By use of the above barrier metal, Al in an Al wiring film formed in the later step is prevented from causing alloy spike in the element active layer in the heat treatment in the later step or the like.

After this, the silicon substrate 41 is subjected to the heat treatment by use of an electric furnace at 600° C., for 30 minutes to 3 hours in the $N_2$ normal pressure atmosphere. By the above heat treatment, densification of the barrier metal (Ti film 43, TiN film 44) is effected and thus barrier metal of high quality can be obtained.

Next, the silicon substrate 41 is fed into a multi-chamber including a substrate introducing chamber with the base pressure of $1 \times 10^{-6}$ Pa, transferring chamber, anisotropic sputtering chamber, heating chamber and substrate extracting chamber. Then, the silicon substrate 41 is transferred to the anisotropic sputtering chamber through the introducing chamber and transferring chamber.

Figure 11B:
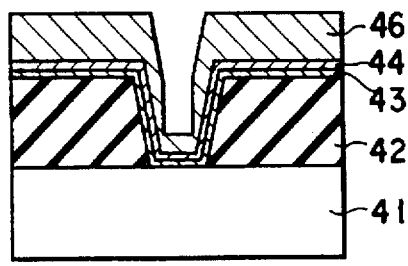

Next, as shown in FIG. 11B, an Al wiring film 44 with a thickness of 0.4 µm is formed by the anisotropic sputtering method in the anisotropic sputtering chamber. The anisotropic sputtering method is preferably a method for setting a distance between the silicon substrate 41 and the Al target longer than that set in the case of the normal sputtering method (for example, 100 to 300 mm) and sputtered Al atoms 45 in a direction perpendicular to the silicon substrate 41 as shown in FIG. 11E, or a method (so-called collimation sputtering method) for providing a barrier plate called a collimator between the silicon substrate 41 and the Al target and sputtering Al atoms 45 in a direction perpendicular to the silicon substrate 41. Further, it is preferable to set the substrate temperature at the sputtering starting time to a low temperature of 150° C. or less.

in the case of this embodiment, since the connection hole 40 formed in the $SiO_2$ film 42 has a tapered form, an amount of Al attached to the side wall of the connection hole 40 is increased. Therefore, an Al wiring film with a thickness of 0.4 µm is formed by the anisotropic sputtering method as in this embodiment, the minimum film thickness of the Al wiring film on the inner wall of the connection hole can be easily made equal to or larger than 20 nm.

Further, the Al wiring film formed by the anisotropic sputtering method is not necessarily pure (All 100%), but may contain Si and Cu in addition to Al such as Al—Si 1wt %-Cu 0.5 wt %.

Figure 11C:
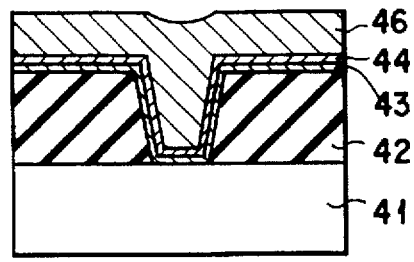

Next, the silicon substrate 41 is fed into the heating chamber through the transferring chamber and subjected to the heat treatment at 500° C. for 3 minutes so as to fill a Al wiring film 46 into the connection hole as shown in FIG. 11C.

In this case, as the heat treatment of the silicon substrate 41, a method for mechanically fixing the silicon substrate 41 on a ceramic heater or fixing the silicon substrate on the ceramic heater by electrostatic force and introducing gas for heat conduction from the rear surface of the substrate is used.

Then, the silicon substrate 41 which has been subjected to the process for filling the Al wiring film 46 by the heat treatment of the substrate is fed into the substrate extraction chamber through the transferring chamber and then extracted to the exterior of the multi-chamber.

Figure 11D:
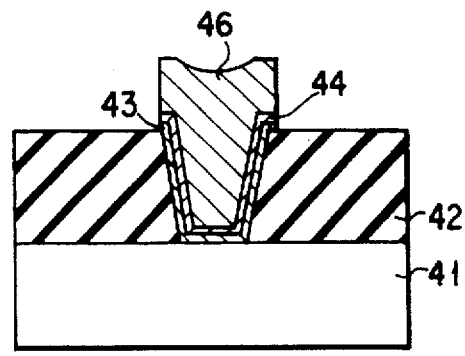
Figure 11E:
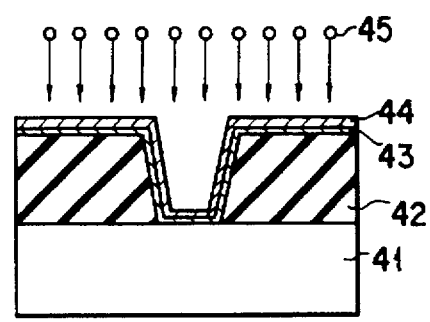

Finally, as shown in FIG. 11D, the Ti film 43, TiN film 44 and Al wiring film 46 are patterned by use of the photolithography and RIE method to complete the Al wiring.

In this embodiment, as described above, the operations for forming the Al wiring film and filling the Al wiring film into the connection hole are continuously effected in the high vacuum atmosphere by use of the multi-chamber including the substrate introducing chamber with base pressure of $1 \times 10^{-6}$ Pa, transferring chamber, anisotropic sputtering chamber, heating chamber and substrate extracting chamber.

The reason why the continuous process in the high vacuum atmosphere is necessary is to prevent the surface of the Al wiring film 46 from being oxidized by residual oxidation gas and prevent the Al surface diffusion from being suppressed. According to the studies of the inventor of this application and others, it is found that the Al wiring film 46 can be filled in the high vacuum atmosphere of $5 \times 10^{-5}$ Pa or more without receiving a bad influence by the above-described oxidation.

Figure 12A:
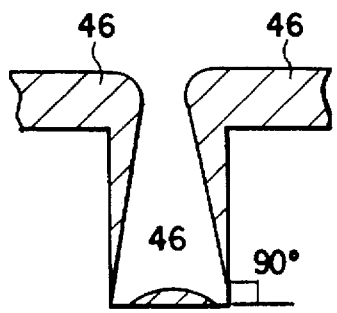
FIGS. 12A to 12D are views for illustrating a variation in the shape of an Al wiring film due to a difference in the tapering angle and film formation method.
Figure 12B:
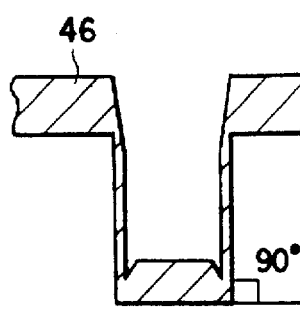
Figure 12C:
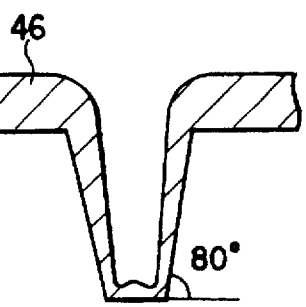
Figure 12D:
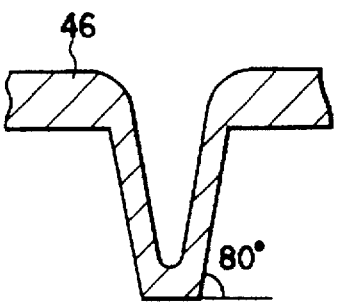

FIG. 12A shows the cross section of a first comparison example in which an Al wiring film is formed in the connection hole with a tapering angle of 90° by the isotropic sputtering method, FIG. 12B shows the cross section of a second comparison example in which an Al wiring film is formed in the connection hole with a tapering angle of 90° by the anisotropic sputtering method, FIG. 12C shows the cross section of a third comparison example in which an Al wiring film is formed in the connection hole with a tapering angle of 80° by the conventional sputtering method, and FIG. 12D shows the cross section of this embodiment in which an Al wiring film is formed in the connection hole with a tapering angle of 80° by the anisotropic sputtering method.

It is understood from FIG. 12A that since the incident direction of Al atoms is not determined in the first comparison example using the isotropic sputtering method, a large amount of Al atoms are attached to a portion near the connection hole, but the viewing angle is small in the bottom portion of the connection hole and the film thickness of the Al wiring film on the bottom portion of the connection hole becomes extremely small.

Therefore, in a case where it is designed to set the film thickness in a portion other than the portion of the connection hole to 0.4 µm, it becomes difficult to attain the Al wiring film thickness of 20 nm or more in the bottom portion of the connection hole. For this reason, agglomeration of Al occurs in the heat treatment in the later process and it becomes impossible to fill the connection hole in some cases.

It is understood from FIG. 12B that since the incident direction of Al atoms is perpendicular to the substrate in the second comparison example using the anisotropic sputtering method, Al atoms can reach the bottom portion of the connection hole even if the viewing angle is small in the bottom portion of the connection hole.

However, in the connection hole having a tapering angle of 90°, the possibility of Al atoms to be attached to the side wall of the connection hole becomes low and the Al wiring film thickness on the side wall of the connection hole becomes extremely small.

Therefore, in a case where it is designed to set the film thickness in a portion other than the connection hole to 0.4 µm, it becomes difficult to easily attain the Al wiring film thickness of 20 nm or more on the side wall of the connection hole in comparison with a case wherein the tapering angle is 80°. For this reason, agglomeration of Al occurs in the heat treatment in the later process and it becomes impossible to fill the connection hole in some cases.

It is understood from FIG. 12C that since the viewing angle is made larger in the third comparison example in which the connection hole is formed to have a tapering angle of 80°, the Al wiring film thickness on the bottom portion of the connection hole can be made sufficiently large even if the isotropic sputtering method is used.

However, since the viewing angle in the bottom portion of the connection hole becomes smaller as the formation of the Al wiring film progresses, it becomes difficult to attain the Al wiring film thickness of 20 nm or more on the side surface of the connection hole in a case where it is designed to set the Al wiring film thickness in a portion other than the connection hole to 0.4 µm.

Therefore, agglomeration of Al occurs in the heat treatment in the later process and it becomes impossible to fill the connection hole.

Further, it is understood from FIG. 12D that both of the Al wiring film thicknesses on the side surface and bottom portion of the connection hole increase when the anisotropic sputtering method is used as in this embodiment and the tapering angle of the connection hole is set to 80°.

Therefore, even in a case where it is designed to set the film thickness in a portion other than the connection hole to 0.4 µm, it becomes possible to attain the Al wiring film thickness of 20 nm or more on the side wall of the connection hole, agglomeration of Al does not occur in the heat treatment in the later process, and it becomes possible to easily fill a connection hole whose aspect ratio (depth of connection hole/opening diameter) is larger than 1 and even a connection hole whose aspect ratio is 2 or more.

As described above, according to this embodiment, since the Al wiring film 46 is formed after the barrier metal is formed of the laminated film of the Ti film 43 and TiN film 44, it is possible to prevent Al in the AL wiring film from being diffused into the SiO$_2$ film 42 and prevent the reliability from being lowered.

Further, according to this embodiment, since the operation of forming the Al wiring film 45 and filling the connection hole with the Al wiring film 45 is effected in the high vacuum atmosphere of $1 \times 10^{-6}$ Pa, occurrence of a bad influence by the oxidation of the surface of the Al wiring film 45 and restriction on the movement of the Al wiring film 46 can be prevented. Therefore, the Al wiring film can be easily filled into the connection hole.

Further, according to this embodiment, since the tapered connection hole 40 is formed and the Al wiring film 46 is formed by the anisotropic sputtering method, agglomeration of Al will not occur in the heat treatment in the later process and it becomes possible to easily fill even a connection hole having an aspect ratio (depth of connection hole/opening diameter) of 2 or more.

(Embodiment 5)

Next, an Al wiring forming method according to a fifth embodiment of this invention is explained. The feature of this embodiment is that an Al wiring film is formed after gas adsorbed on the surface of the substrate, particularly, adsorbed gas in an area in which an Al wiring film is formed is removed or eliminated.

In this case, the substrate includes a structure which is obtained before the Al wiring film is formed and which can be called a substrate in a wide sense.

First, an insulation film having a connection hole whose aspect ratio is larger than 1 is formed on a silicon substrate by the CVD method in the same manner as in the fourth embodiment, and then, a laminated film of Ti film and TiN film is formed by the CVD method. Next, the silicon substrate is subjected to the heat treatment at 600° C., for 30 minutes in the $N_2$ normal pressure atmosphere by use of an electric furnace to densify the laminated film.

Then, the silicon substrate is fed into a multi-chamber including a substrate introducing chamber with the base pressure of $1 \times 10^{-6}$ Pa, transferring chamber, pre-processing chamber, anisotropic sputtering chamber, heating chamber and substrate extracting chamber.

Then, the silicon substrate is transferred to the pre-processing chamber from the substrate introducing chamber through the transferring chamber. In this case, since the silicon substrate is introduced into the chamber from the atmospheric air, gas such as water in the atmospheric air is adsorbed on the surfaces of the laminated film of Ti film and TiN film and the silicon substrate.

Therefore, in order to remove the gas adsorbed on the surface of the laminated film of Ti film and TiN film and the like, for example, the process of heating the silicon substrate at 500° C. for 5 minutes is effected in the pre-processing chamber. In this case, the heat treatment for the silicon substrate is effected by use of a ceramic heater or halogen lamp, for example.

Removal of the adsorbed gas is effective in the first to fourth embodiments and sixth and seventh embodiments to be described later.

Then, the silicon substrate is fed into the anisotropic sputtering chamber without being exposed to the atmospheric air. The silicon substrate fed into the anisotropic sputtering chamber is cooled to low temperatures equal to or lower than 150° C. by cooling the substrate stage of the anisotropic sputtering chamber. After the silicon substrate is cooled, an Al wiring film with a thickness of 0.4 μm is formed on the entire surface.

Finally, the Al wiring film is caused to flow into the connection hole by heating the substrate in the same manner as in the fourth embodiment, and then, the Al wiring film and the like are patterned to complete the Al wiring.

In this embodiment, the Al wiring film is formed after gas adsorbed on the surface of the laminated film of Ti film and TiN film is removed or eliminated. This is because the adsorbed gas may accelerate agglomeration of a metal film such as Al wiring film or the like. Agglomeration of the thin metal film by the adsorbed gas is a phenomenon which is newly detected as the result of studies by the inventor of this application and others.

Therefore, as in this embodiment, suppression of agglomeration of the thin metal film by removing the adsorbed gas in the method of causing the metal wiring film to flow into and fill the connection hole leads to enhancement of the filling characteristic.

Generally, in the LSI, inter-level insulation films are formed by use of the CVD method in many cases. However, the CVD film has adsorptivity and emits gas such as water in the heat treatment process for heating, for example. Since the emitted gas causes the fluidity of the Al wiring film formed in the later step to be degraded, it is necessary to remove the emitted gas before the Al wiring film is formed.

Therefore, in this embodiment, in order to remove the emitted gas, the silicon substrate is subjected to the heat treatment in the $N_2$ normal pressure atmosphere at 600° C. for 30 minutes before the Al wiring film is formed. As the atmosphere other than the $N_2$ atmosphere, the inert gas atmosphere of Ar or the like or the reducing atmosphere of $H_2$ of the like can be used.

If the silicon substrate is exposed to the atmospheric air after the heat treatment, $H_2O$ and $N_2$ gases in the atmospheric air are adsorbed on the substrate surface. For this reason, it is necessary to effect the adsorbed gas removing step following on the Al wiring film forming step in an atmosphere such as vacuum which is free from re-adsorption, for example. Therefore, as in this embodiment, it is necessary to remove the adsorbed gas by the heat treatment in vacuum. Further, according to the study of the inventor of this application and others, it is confirmed that if the adsorbed gas is removed by the heat treatment in vacuum as in this embodiment, the Al wiring film can be filled into the connection hole having an aspect ratio larger than 2.

Further, in this embodiment, the silicon substrate is cooled before the Al wiring film is formed. This is because Al atoms flying onto the silicon substrate are actively diffused on the surface of the substrate to grow in an island form, thereby causing the homology of the film to be degraded, if the silicon substrate is kept at high temperatures.

Degradation in the homology of the film causes discontinuity in the film thickness and aggregation tends to occur in the thin film portion. According to the study of the inventor of this application and others, it is confirmed that if the substrate temperature is equal to or lower than 150° C., the homology of the Al wiring film is not degraded and the filling characteristic is not influenced.

However, since the silicon substrate is heated to a high temperature in the adsorbed gas removing step, a long time is necessary to leave (naturally cool) the silicon substrate until the substrate temperature is lowered to a sufficiently low temperature, thereby increasing time necessary for the step. Therefore, it is preferable to provide the substrate cooling function in the Al wiring film growing chamber as in this embodiment.

(Embodiment 6)

Next, an Al wiring forming method according to a sixth embodiment of this invention is explained. This embodiment is similar to the fifth embodiment except that gas adsorbed on the substrate surface is removed by irradiation of ions. The Al wiring forming method of this embodiment is concretely explained.

First, an insulation film having a connection hole whose aspect ratio is larger than 1 is formed on a silicon substrate in the same manner as in the fourth embodiment, and then, a laminated film of Ti film and TiN film is formed on the entire surface. Next, the silicon substrate is subjected to the heat treatment at 600° C., for 30 minutes in the $N_2$ normal pressure atmosphere by use of an electric furnace.

Then, the silicon substrate is fed into a multi-chamber including a substrate introducing chamber with the base pressure of $1 \times 10^{-6}$ Pa, transferring chamber, pre-processing chamber, anisotropic sputtering chamber, heating chamber and substrate extracting chamber.

Then, the silicon substrate is transferred to the pre-processing chamber from the substrate introducing chamber through the transferring chamber. In the pre-processing chamber, a susceptor for disposing the silicon substrate thereon is provided and a high frequency electric power of 13.56 MHz, for example, can be applied to the susceptor. In this case, since the silicon substrate is introduced into the substrate introducing chamber from the atmospheric air, gas such as water in the atmospheric air is adsorbed on the surface of the substrate.

Next, in order to remove the gas adsorbed on the surface of the substrate, for example, the process of introducing Ar gas of pressure of 40 Pa into the pre-processing chamber and applying a high frequency electric power of 100 W to the susceptor so as to generate plasma and irradiate Ar ions on the silicon substrate for 20 seconds is effected. Since the laminated film of Ti film and TiN film on the substrate surface is used as the barrier metal, it is preferable to irradiate ions in a condition that the laminated film is not sputtered.

Then, after the silicon substrate is fed into the anisotropic sputtering chamber without being exposed to the atmosphere, an Al wiring film with a thickness of 0.4 µm is formed on the entire surface by the anisotropic sputtering method. When the substrate temperature is raised by ion irradiation for removal of adsorbed gas, the silicon substrate fed into the anisotropic sputtering chamber is cooled to low temperatures equal to or lower than 150° C. by cooling the substrate stage disposed in the anisotropic sputtering chamber.

Finally, the Al wiring film is filled into the connection hole in the same manner as in the fourth embodiment, and then, the Al wiring film and the like are patterned to complete the Al wiring.

In this embodiment, ions are irradiated into the silicon substrate in order to remove adsorbed gas. Since the adsorbed gas is not chemically bonded to the laminated film of Ti film and TiN film and the silicon substrate, the adsorption force thereof is weak. Therefore, the adsorbed gas can be easily separated from the laminated film and silicon substrate by striking ions having ion energy which is so weak as not to sputter the laminated film and silicon substrate against the laminated film and silicon substrate and thus the laminated film and silicon substrate can be prevented from being damaged.

In this embodiment, adsorbed gas is removed by irradiation of ions, but it is possible to remove the adsorbed gas by application of ultraviolet rays. In this embodiment, irradiated ions are positive ions, but negatively charge particles such as negative ions or electrons can be used.

(Embodiment 7)

Next, an Al wiring forming method according to a seventh embodiment of this invention is explained.

First, an insulation film having a connection hole whose aspect ratio is larger than 1 is formed on a silicon substrate in the same manner as in the first embodiment, and then, a laminated film of Ti film and TiN film is formed on the entire surface.

Next, an Al wiring film with a thickness of 0.6 µm is formed on the laminated film by use of the DC magnetron sputtering method without heating.

Then, Ar gas is caused to flow at a rate in the range of 10 to 1000 sccm and the gas flow is adjusted and maintained in the range of 0.1 to 100 Pa by use of a conductance valve, an RF power of 13.56 MHz is adjusted in the range of 10 to 100 W/cm$^2$, for example, and is applied to the substrate to cause plasma discharge so as to irradiate ions having first ion energy to the Al wiring film. At this time, the substrate is not heated.

The Al wiring film is etched by 0.2 µm in the same manner as in the second embodiment by irradiation of ions having the first ion energy and the minimum film thickness on the internal surface of the connection hole is set to 20 nm or more.

Then, the silicon substrate is fed into a processing chamber by vacuum and fed to and fixed on a ceramic heater which is previously heated to 200° to 500° C., for example. Fixation of the substrate is effected by use of electrostatic chuck, for example, and the heat treatment may be effected in a state in which Ar gas is introduced into under the rear surface of the substrate to enhance the heat conduction efficiency.

Then, Ar gas is caused to flow at a rate in the range of 10 to 1000 sccm and the gas flow is adjusted and maintained in the range of 0.1 to 100 Pa by use of a conductance valve, an RF power of 13.56 MHz is adjusted in the range of 1 to 10 W/cm$^2$, for example, and is applied to the substrate to cause plasma discharge so as to irradiate ions having second ion energy to the Al wiring film. The attainable degree of vacuum of the processing chamber is set to high degree of vacuum of $10^{-6}$ Pa.

At this time, the second ion energy is set to be less than the first ion energy so that the surface of the Al wiring film will be little etched by irradiation of ions having the second ion energy.

Irradiation of charged particles having the second ion energy is effective in the first to sixth embodiments. The removal of the absorbed gas is effective in those cases.

Even when the substrate heating temperature is low, surface diffusion of Al atoms in the surface of the Al wiring film is accelerated by striking Ar ions by irradiation of charged particles having the second ion energy and the Al atoms diffused in the surface move into the connection hole to lower the free energy, thus filling the connection hole with the Al wiring film.

Finally, the laminated film and Al wiring film are patterned in the same manner as in the former embodiment to complete an Al wiring film.

Since the viewing angle of incident Ar ions in the internal portion of the connection hole is smaller than in the flat portion of the substrate, acceleration of diffusion of the Al atoms by Ar ions is suppressed more in the deeper portion of the connection hole and the substrate temperature is kept low, thereby preventing agglomeration of the Al wiring film in the bottom portion of the connection hole. In this embodiment, it is confirmed that a connection hole having an aspect larger than 2 can be filled even at low temperatures.

In this embodiment, parallel plate type (capacitive coupling type) plasma discharge is used. In this type, it is difficult to separately control the ion density and ion energy. In this invention, it is preferable to efficiently accelerate the diffusion of Al atoms in the surface thereof by suppressing etching of the Al wiring film by lowering the ion energy and enhancing the ion density to irradiate a large number of ions on the Al surface.

Therefore, it is considered to use microwave excitation plasma such as ECR plasma or helicon plasma capable of separately controlling the ion density and ion energy. With the microwave excitation plasma, since the discharging gas pressure can be set low, the plasma discharge can be set up without lowering the gas exhausting speed of the pump in the processing chamber. When the gas exhausting speed of the pump is not lowered, the attainable degree of vacuum of the processing chamber can be enhanced and the Al wiring film can be filled into the connection hole while the surface diffusion is suppressed by the natural oxide film.

In this embodiment, Ar is used as the gas in the discharge, but it is possible to use atoms such as hydrogen atoms (H) having a small mass number so as not to etch the Al wiring film. Particularly, ionized hydrogen atoms have high reducing ability and are effective to remove a natural oxide film which will be formed even in high degree of vacuum. In this respect, use of discharge by a mixture of Ar and $H_2$ is effective. Further, it is possible to use inert gas such as Kr or Xe having a large mass number in a condition that the ion energy is lowered. In this case, since the mass number is large, the atoms will not enter the Al wiring film and surface diffusion of only Al atoms in the surface can be efficiently accelerated.

(Embodiment 8)

Next, a heating (heat treatment) method, which is the eighth embodiment of the invention, will now be explained. In this method, a wiring of the type used in the first to seventh embodiments and formed of the polycrystalline structure described above is repeatedly subjected to a temperature-raising and -lowering process, at least two times.

The heat treatment method of this invention is based on the following knowledge.

That is, as a result of observing the process of crystal growth with time, it was found that most part of an increase in the grain size occurred in the temperature raising process of the heat treatment process. Therefore, the crystal grain size obtained when the time for the heat treatment at a high temperature was set long was compared with the crystal grain size obtained when the time for the heat treatment at the high temperature was set to the same length but the process of first lowering the temperature and then raising the temperature was repeatedly effected in the heat treatment process at the same temperature, and it was found that the average grain size obtained when the process of lowering and raising the temperature was repeatedly effected was larger than that obtained in the former case and almost no small crystal grain was found. As a result, it was found that the grain boundary structure in the wiring took the form of complete bamboo structure and the reliability of the wiring was significantly enhanced.

Next, a case wherein an Al film is used as a conductive film of polycrystalline structure and the heat treatment is effected by use of an electric furnace is concretely explained.

Figure 7:
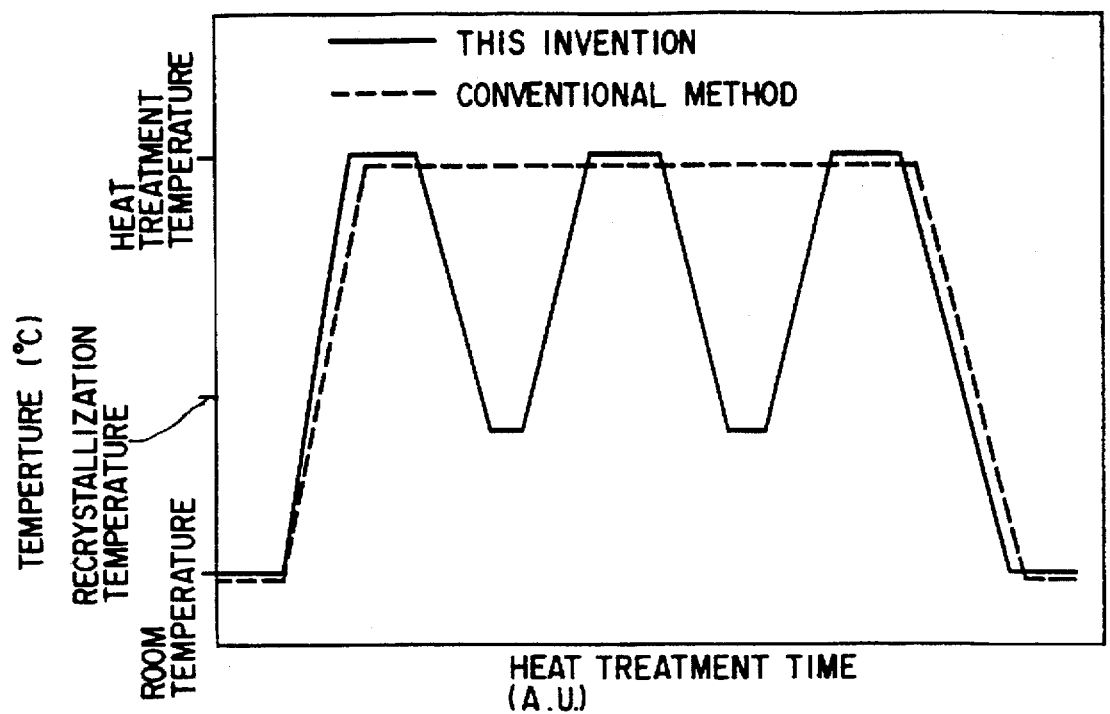
FIG. 7 is a diagram for illustrating a difference between the heat treatment of this invention and the conventional heat treatment.

In FIG. 7, a characteristic diagram for illustrating a difference between the heat treatment of this invention and the conventional heat treatment is shown.

In the conventional method, the Al film is subjected to the heat treatment of approx. 450° C. for 5 to 30 minutes. That is the heat treatment at the constant temperature is effected only once.

On the other hand, in this invention, as indicated by the solid line in the drawing, the heat treatment is effected by plural times. That is, the heat treatment including the temperature raising step and temperature lowering step is repeatedly effected by at least two times. In this case, it is not necessary to lower the temperature to the room temperature in the temperature lowering step and it may be sufficient to lower the temperature to a temperature which is lower than approximately the recrystallization temperature of the object conductive film. In the case of Al, it is approx. 200° C.

Since most part of the crystal growth occurs in the temperature raising step, it is not necessary to take a long time for the heat treatment at the high temperature in this invention, and the effect of this invention can be attained even if the cooling step is started immediately after a preset heat treatment temperature is reached.

Figure 8:
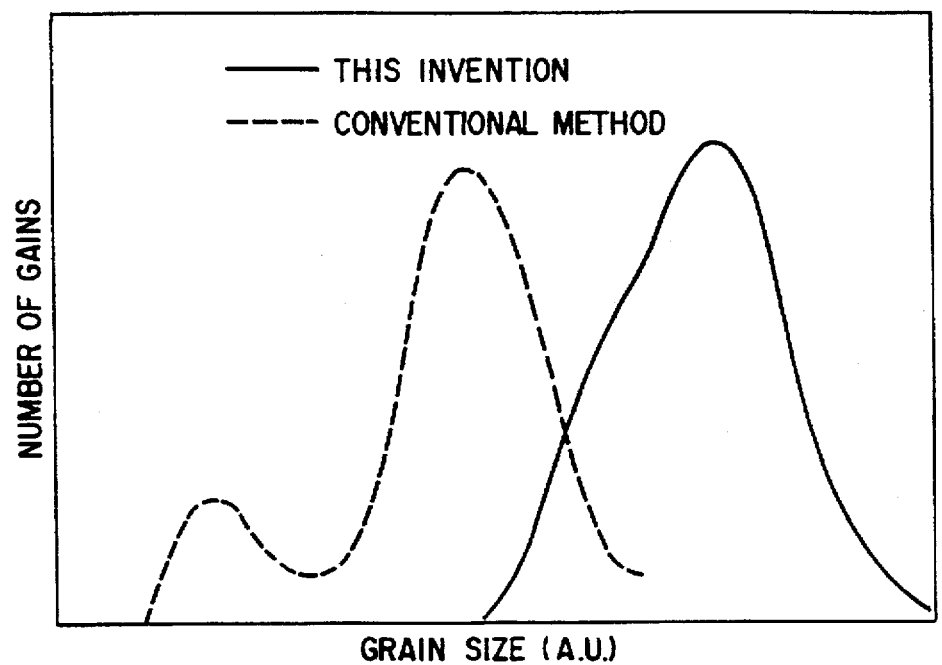
FIG. 8 is a characteristic diagram showing the result of the grain size distribution after the heat treatment of this invention and that of the conventional case.

FIG. 8 shows the result of comparison of the result of the grain size distribution after the heat treatment of this invention and that of the conventional case. In the conventional heat treatment process, the grain size distribution as indicated by broken lines was obtained. This was basically kept unchanged even if the heat treatment at high temperature for short time was effected by use of a lamp, and the average crystal grain size was increased, but small crystal grains were still left. As a result, the service life thereof becomes short because of the initial defect.

On the other hand, the grain size distribution obtained by the heat treatment of this invention indicates the normal distribution that the average crystal grain size is increased and no peak of small crystal grains is present as indicated by the solid line in the drawing.

Further, as a result of examining the grain boundary structure in the wiring, the following difference in the grain boundary structure was found.

That is, as shown in FIG. 9A, in the Al wiring subjected to the heat treatment of this invention, no triple point grain boundary was present and a complete bamboo grain boundary structure 30 was formed.

On the other hand, as shown in FIG. 9B, in the Al wiring subjected to the heat treatment of the conventional method, triple point grain boundaries 31 were present. The triple point grain boundaries 31 may be a cause for shortening the service life.

FIG. 10 shows the result of comparison of the distribution of wiring service life of an Al wiring which is subjected to the heat treatment of this invention with that of the conventional case.

In the conventional case, the average wiring service life is short and the initial defect is present. On the other hand, the distribution of service life of wirings obtained by repeatedly effecting the heat treatment process of this invention completely follows the logarithmic normal distribution with testing time and the initial defect will not be shifted towards the short service life side.

Thus, the heat treatment process of this invention is to repeatedly effect the temperature raising and lowering process by at least two times so as to eliminate small crystal grains by increasing the grain size thereof or causing them to be absorbed into other large crystal grains and construct the grain boundary structure in the wiring only by the bamboo grain boundary, thereby significantly improving the EM resistance and enhancing the reliability of the wiring.

The effect of the heat treatment process of this invention can be attained irrespective of the structure of the Al wiring and can also be attained in an Al wiring structure such as an Al single layered wiring, Al wiring on a barrier metal, and an Al wiring having a reflection preventing film formed thereon.

Further, the heat treatment process of this invention may be effected either before the Al wiring film is processed in a wiring form or after the processing of the Al wiring film (for example, after formation of a wiring passivation film).

Further, the heat treatment process of this invention is effective when a conductive material such as Au, Cu is used as the wiring material other than Al.

In addition, the heat treatment process of this invention is effective when lamp annealing or laser annealing is used as the heat treatment instead of the electric furnace.

The heat treatment process of this invention is put into practice based on the background of the following conventional art.

Conventionally, the high integration density and high speed of the semiconductor integrated circuit has been attained mainly by miniaturization of elements and formation of the wiring in a multi-layered form. One of the important problems caused by miniaturization of elements and formation of multi-layered wiring is degradation in the reliability of the metal wiring. There are various defect generation modes of miniaturized metal wirings of the semiconductor device, for example, wiring breakage mode of electromigration or stress migration, short circuit between layers or lines by occurrence of hillock, and corrosion of the wiring caused by the short circuit. The above reliability degrading phenomena are significant in Al wirings mainly used at present. This is because the melting point of Al is low and Al atoms can be easily moved and diffused by stresses such as heat or stress.

Among the above phenomena, electromigration tends to increase the current density in the wiring in order to enhance the element speed and is the most important problem to be solved. It is understood that the main cause of the reliability degrading mechanism is grain boundary diffusion. As the measure against the electromigration, several heat treatment processes for increasing the average grain size of the polycrystalline metal wiring to reduce the density in the grain boundary so as to reduce the grain boundary in the wiring are proposed.

For example, methods for effecting the heat treatment process by high-temperature short-time heating by use of a lamp or laser in a state in which a reflection preventing film such as a carbon film which can easily absorb infrared rays is mounted on a wiring metal film are proposed.

However, at present, the reliability enhancing effect cannot be sufficiently attained by the above methods. The reason is that crystal grains of small grain size are present in the wiring although not so many, and triple point grain boundaries are formed, and voids are created and grow from the grain boundaries to cause breakage of the wiring.

In order to solve the above problem, in this invention, the above-described heat treatment process is effected so as to completely eliminate small crystal grains by increasing the grain size thereof or causing them to be absorbed into other large crystal grains and construct the grain boundary structure in the wiring only by the bamboo grain boundary, thereby enhancing the reliability of the wiring.

In the first to eighth embodiments, it is preferable to set up a non-oxidation atmosphere or high vacuum atmosphere in which a surface native oxide film cannot be formed as the atmosphere used at the time of formation of the Al wiring film, transferring of the silicon substrate, and heating of the silicon substrate since the native oxide film formed on the surface of the Al wiring film may prevent surface diffusion of Al atoms.

Further, in the first to eighth embodiments, it is possible to add impurities into the Al wiring film so as to cause plastic flow of the Al wiring film at low temperatures.

In the first to eighth embodiments, heating of the silicon substrate is effected by use of the ceramic heater or electric furnace, but it is possible to use heating means such as lamp heating means or induction heating means, and in this case, it is preferable to set the attainable temperature lower than the melting point of the Al wiring film. Further, for heating of the silicon substrate (heating of the AL wiring film), it is preferable to use the heating method of this invention in which the temperature raising and lowering process is repeatedly effected by at least two times after the Al wiring film is formed as will be described later in a case where the conductive film used as the wiring is formed in the form of polycrystalline structure and the crystal grain diameter can be increased by this method.

Further, in the first to eighth embodiments, it is possible to additionally form an Al wiring film so as to assist the filling operation or increase the film thickness while the operation of filling the Al wiring film into the connection hole is being effected or after the filling operation is completed.

In the first to eighth embodiments, a case wherein the silicon substrate is used as the substrate is explained, but another substrate can be used.

In the first to eighth embodiments, a case wherein the Al wiring film is formed of an alloy of Al, Si and Cu is explained, but this invention is effective for a pure Al wiring film, and conductive materials such as Cu, Ag, Au, alloys of the conductive materials or alloys of the conductive materials and Al can be used.

This invention is not limited to the above embodiments. For example, in the first to seventh embodiments, a case wherein the Al wiring film is filled into the connection hole is explained, but this invention is not limited to the connection hole, and is also effective for filling an concave portion formed on the surface of an insulation film, for example, filling a wiring-form groove used for forming a buried type wiring.

That is, in the case of buried type wiring, the wiring film may be selectively filled into the concave portion by the processing method such as the chemical/mechanical polishing method or etch-back method after the wiring film is formed.

Further, this invention can be effectively applied to the operation of filling the connection hole or concave portion whose opening diameter or groove width is equal to or less than 1 μm or even 0.4 μm.

Further, the laminated film of Ti film and TiN film is used as the conductive covering film, but this invention is not limited to the laminated film, and a refractory metal film, refractory metal nitride film, refractory metal silicide film, or a laminated film of the above films such as a laminated film of the refractory metal film and the refractory metal nitride film, or a laminated film of the refractory metal silicide film and the refractory metal nitride film can be used. As the refractory metal, W, Mo, Nb, Ta may be used instead of Ti.

This invention can be variously modified without departing from the technical scope thereof.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A wiring forming method comprising the steps of:
   forming an insulating film on a substrate;

forming a connection hole in the insulating film;

forming a conductive film on the insulating film and in the connection hole, while causing the conductive film to absorb a gas;

heating the substrate to a temperature not driving the gas out of the conductive film and filling the conductive film into the connection hole while maintaining a continuity of the conductive film; and before or after shaping the conductive film to provide a wiring, heating the substrate to a temperature at which the gas is driven out of the conductive film.

2. A wiring forming method according to claim 1, wherein charged particles are applied to said conductive film to accelerate diffusion of atoms in a surface layer of said conductive film without subjecting said conducting film to sputter-etching at the time of heating said substrate in said filing step.

3. A wiring forming method according to claim 1, wherein gas adsorbed to at least the side and bottom of said connection hole is removed before said conductive film is formed.

4. A wiring forming method according to claim 1, wherein charged particles are applied to said conductive film to accelerate diffusion of atoms in a surface layer of said conductive film without subjecting said conducting film to sputter-etching at the time of heating said substrate in said filling step, and gas adsorbed to at least the side and bottom of said connection hole is removed before said conductive film is formed.

5. A wiring forming method according to claim 1, comprising a step of forming a conductive film whose minimum film thickness on the internal surface of said connection hole is equal to or greater than 20 nm on the surface of said insulating film and in said connection hole.

6. A method for manufacturing a semiconductor substrate comprising the steps of:

forming an insulating film on a substrate;

forming a polycrystalline conductive film on the insulating film;

shaping the polycrystalline conductive film to form a wiring; and after forming the film and before or after forming the wiring, subjecting the polycrystalline conductive film, to a temperature-raising and-lowering process, repeatedly at least twice to a temperature below a recrystallization temperature of the polycrystalline conductive film.

* * * * *